(12) United States Patent
Yao et al.

(10) Patent No.: US 8,716,846 B2
(45) Date of Patent: May 6, 2014

(54) PRESSURE SENSOR AND METHOD OF PACKAGING SAME

(75) Inventors: Jinzhong Yao, Tianjin (CN); Wai Yew Lo, Petaling Jaya (MY); Lan Chu Tan, Shah Alam (MY); Xuesong Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 3 days.

(21) Appl. No.: 13/293,119

(22) Filed: Nov. 10, 2011

(65) Prior Publication Data

US 2012/0168884 A1 Jul. 5, 2012

(51) Int. Cl.
*H01L 23/495* (2006.01)

(52) U.S. Cl.
USPC .................................. 257/666; 257/E23.126

(58) Field of Classification Search
CPC ..................... H01L 23/24; H01L 2224/48247; H01L 2224/48227
USPC .......................................... 257/666, E23.126
See application file for complete search history.

(56) References Cited

U.S. PATENT DOCUMENTS

| | | | |
|---|---|---|---|
| 4,314,225 A | 2/1982 | Tominaga | |
| 5,581,226 A | 12/1996 | Shah | |
| 5,604,363 A | 2/1997 | Ichihashi | |
| 5,692,637 A | 12/1997 | Hodge | |
| 5,719,069 A | 2/1998 | Sparks | |
| 5,811,684 A | 9/1998 | Sokn | |
| 5,831,170 A | 11/1998 | Sokn | |
| 5,874,679 A | 2/1999 | Sokn | |
| 5,877,093 A | 3/1999 | Heffner | |
| 5,996,419 A | 12/1999 | Sokn | |
| 6,094,356 A | 7/2000 | Fujisawa | |
| 6,266,197 B1 | 7/2001 | Glenn | |
| 6,351,996 B1 | 3/2002 | Nasiri | |
| 6,401,545 B1 | 6/2002 | Monk | |
| 6,440,777 B2 | 8/2002 | Cobbley | |
| 6,566,168 B2 | 5/2003 | Gang | |
| 6,707,168 B1 | 3/2004 | Hoffman | |
| 6,900,531 B2 | 5/2005 | Foong | |
| 7,014,888 B2 | 3/2006 | McDonald | |
| 7,323,766 B2 * | 1/2008 | Weiblen et al. | 257/666 |
| 7,462,940 B2 | 12/2008 | Bauer | |
| 7,469,590 B2 | 12/2008 | Fukuda | |
| 7,549,344 B2 | 6/2009 | Yamamoto | |
| 7,607,355 B2 | 10/2009 | Shirasaka | |
| 7,632,698 B2 | 12/2009 | Hooper | |
| 7,673,519 B1 | 3/2010 | Fuhrmann | |
| 7,705,242 B2 | 4/2010 | Winterhalter | |
| 7,886,609 B2 | 2/2011 | Lo | |
| 8,359,927 B2 | 1/2013 | Hooper | |

(Continued)

*Primary Examiner* — Steven J Fulk
(74) *Attorney, Agent, or Firm* — Charles Bergere

(57) ABSTRACT

A method of packaging a pressure sensor die includes providing a lead frame having a die pad and lead fingers that surround the die pad. A tape is attached to a first side of the lead frame. A pressure sensor die is attached to the die pad on a second side of the lead frame and bond pads of the die are connected to the lead fingers. An encapsulant is dispensed onto the second side of the lead frame and covers the lead fingers and the electrical connections thereto. A gel is dispensed onto a top surface of the die and covers the die bond pads and the electrical connections thereto. A lid is attached to the lead frame and covers the die and the gel, and sides of the lid penetrate the encapsulant.

7 Claims, 5 Drawing Sheets

(56) References Cited

U.S. PATENT DOCUMENTS

| | | |
|---|---|---|
| 2002/0041019 A1 | 4/2002 | Gang |
| 2002/0063326 A1 | 5/2002 | Nakashima |
| 2004/0014266 A1 | 1/2004 | Uno |
| 2004/0187977 A1 | 9/2004 | Matsui |
| 2004/0245320 A1 | 12/2004 | Fukagaya |
| 2005/0104168 A1 | 5/2005 | Choi |
| 2005/0146000 A1* | 7/2005 | Kim et al. .................... 257/670 |
| 2005/0189621 A1 | 9/2005 | Cheung |
| 2005/0236644 A1* | 10/2005 | Getten et al. ................. 257/106 |
| 2005/0279166 A1* | 12/2005 | Shizuno ......................... 73/493 |
| 2007/0023873 A1 | 2/2007 | Park |
| 2007/0298276 A1 | 12/2007 | Teshima |
| 2008/0050267 A1 | 2/2008 | Murai |
| 2009/0045498 A1* | 2/2009 | Braden et al. ................. 257/687 |
| 2009/0072399 A1 | 3/2009 | Terashima |
| 2009/0211784 A1 | 8/2009 | Grogl |
| 2011/0260266 A1* | 10/2011 | Han et al. ..................... 257/415 |
| 2012/0139067 A1* | 6/2012 | Lo et al. ....................... 257/417 |

* cited by examiner

PRESSURE SENSOR AND METHOD OF PACKAGING SAME

BACKGROUND OF THE INVENTION

The present invention relates generally to pressure sensor packaging, and more particularly to a method of assembling quad flat no-lead (QFN) pressure sensor packages.

Pressure sensors and pressure sensor packages are well known and come in a variety of sizes and configurations. Pressure sensor dies typically have a thin differential pressure-sensing membrane that is susceptible to mechanical damage during handling and packaging. For this reason, these sensor dies are typically mounted in pre-molded packages and then sealed in the packages using a separate cover or lid.

One way of packaging the pressure sensor dies is mounting the dies to a premolded lead frame and encapsulating the die with a mold compound. However, dies such as piezo resistive transducer (PRT), parameterized layout cell (Pcell) and Gyro do not allow full encapsulation because that would impede their functionality. As a result, a metal lid or cap must be placed on a mold wall to protect the dies from the outside environment. In addition, pre-molded lead frames are relatively expensive, making the overall packaging costs unattractive.

Accordingly, it would be advantageous to be able to efficiently package pressure sensor dies in which the risk of environmental damage to the pressure sensor die is reduced or eliminated while reducing the overall packaging costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise.

It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of packaging a pressure sensor die. The method includes providing a lead frame having at least one die pad and a plurality of lead fingers. A tape is attached to a first side of the lead frame and a pressure sensor die is attached to the at least one die pad on a second side of the lead frame and bond pads of the pressure sensor die are electrically connected to the lead fingers of the lead frame. An encapsulating material is dispensed onto the second side of the lead frame. The encapsulating material covers the lead fingers and the electrical connections thereto. A gel is dispensed onto a top surface of the pressure sensor die such that gel covers the die bond pads and the electrical connections thereto. A lid is attached to the lead frame such that the lid covers the pressure sensor die and the gel thereon. The encapsulating material and the gel are then cured.

In another embodiment, the present invention is a packaged pressure sensor die formed in accordance with the above-described method.

Figure 1A:
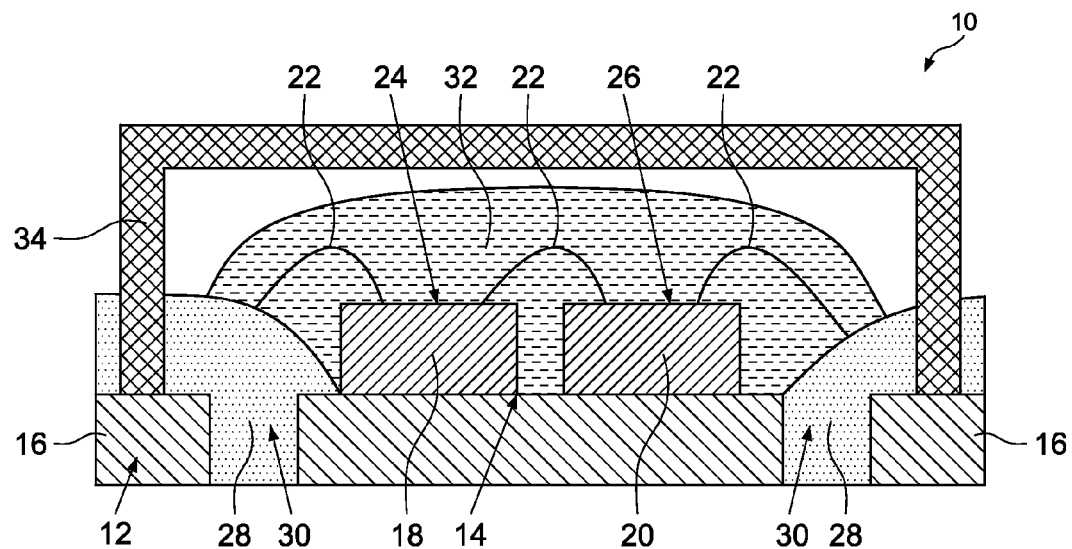
FIG. 1A is a cross-sectional view of a pressure sensor package in accordance with one embodiment of the present invention.

Referring now to FIG. 1A, a cross-sectional view of a packaged pressure sensor die 10 is shown. The packaged pressure sensor die 10 includes a lead frame 12 with at least one die pad 14 and a plurality of lead fingers 16 that surround the at least one die pad 14. The lead frame 12 may be formed of copper, an alloy of copper, a copper plated iron/nickel alloy, plated aluminum, or the like.

A pressure sensor die 18 is attached to the die pad 14 and is electrically coupled to the lead fingers 16. In this exemplary embodiment of the invention, the pressure sensor die 18 includes a piezo resistive transducer (PRT) die. The pressure sensor die 18 may be attached to the lead frame 12 using a die attach adhesive. The pressure sensor die 18 and the lead frame 12 are well known components of pressure sensors and thus detailed descriptions and possible alternative embodiments thereof are not necessary for a complete understanding of the present invention.

In the illustrated embodiment of the invention, a second die 20 is attached to the die pad 14 and is electrically coupled to the lead fingers 16. Alternately, the second die 20 may be attached to a separate die pad (not shown) of the lead frame. In one exemplary embodiment of the invention, the second die 20 includes an integration circuit such as a controller.

In this exemplary embodiment of the invention, the pressure sensor die 18 and the second die 20 are attached and electrically coupled to the lead fingers 16 of the lead frame 12 with wires 22. The wires 22 are bonded to pads on respective active surfaces 24 and 26 of the pressure sensor die 18 and the second die 20 and to corresponding contact pads on the lead frame 12 using a well known wire bonding process and known wire bonding equipment.

Another way of electrically connecting the pressure sensor die 18 and the second die 20 to the lead frame 12 is to connect bond pads of the pressure sensor die 18 and the second die 20 to the lead fingers 16 with flip-chip bumps (not shown) attached to an underside of each of the pressure sensor die 18 and the second die 20. The flip-chip bumps may include solder bumps, gold balls, molded studs, or combinations thereof.

A glob top encapsulating material 28 is deposited onto a top surface of the lead frame 12 and within gaps 30 between the die pad 14 and the lead fingers 16. The glob top encapsulating material 28 covers the lead fingers 16 and the electrical connections 22 thereto, i.e., the wire bonds.

In this exemplary embodiment, the glob top encapsulating material 28 includes epoxy. A measured volume of the glob top encapsulating material 28 is dispensed over the top surface of the lead frame 12 using known dispensing equipment such as a dispensing nozzle or needle connected to a reservoir of the encapsulating material 28.

A gel 32 such as a silicon-based gel is dispensed onto the top surfaces 24 and 26 of the pressure sensor die 18 and the second die 20. The gel 32 covers the die bond pads and the electrical connections 22 thereto.

The packaged pressure sensor die 10 includes a lid 34 that covers the two dies 18, 20, the gel 32, and the sides of the lid 34 and penetrates the glob top encapsulating material 28 and contacts the lead frame 12. The lid 34 may include a footed metal lid. In this exemplary embodiment of the invention, the lead frame 12 includes tie bars 36 (FIG. 1B) that extend outwardly from the die pad 14. The lid 34 contacts the tie bars 36, but is electrically isolated from the lead fingers 16. The lid 34 may be attached to the lead frame 12 with a lid attach adhesive like non-conductive epoxy, other suitable attaching mechanisms, or simply held in place by the encapsulating material 28. Although the outer sides of the lid 34 as shown in FIG. 1A are not flush with the outer sides of the lead frame 12, it should be understood by those of skill in the art that they could be. However, if the encapsulating material 28 is used to maintain the lid 34 in place then it is preferred to that the lid 34 is aligned as shown in FIG. 1A. The example configuration of the pressure sensor package 10 of FIG. 1A may be assembled in a flat no-lead package.

Figure 1B:
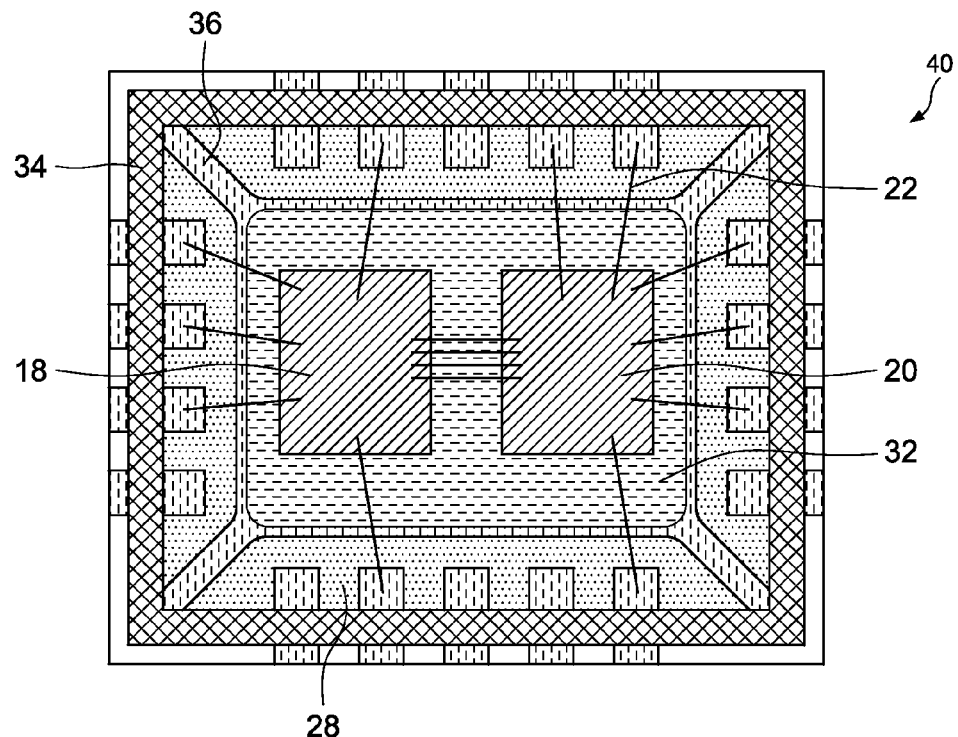
FIG. 1B is a top view of a quad flat no-lead (QFN) pressure sensor package in accordance with one embodiment of the present invention.

Referring now to FIG. 1B, a top view of a quad flat no-lead (QFN) sensor package 40 is shown. As illustrated, the encapsulating material 28 covers the lead fingers 16 and the electrical connections 22 thereto. The gel 32 covers the dies 18 and 20 along with the corresponding die bond pads and the electrical connections thereto.

As will be appreciated by one skilled in the art, the pressure sensor die 18 and the second die 20 and the electrical connections are protected from being damaged due to environmental influences in the illustrated package 40 by the encapsulation material 28 and the gel 32. This design does not require a premolded QFN leadframe.

Figure 2:
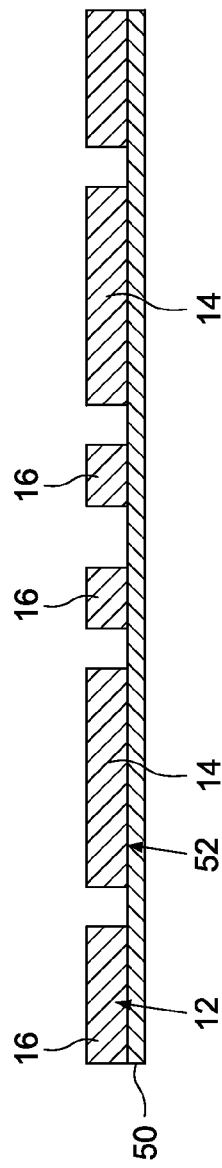
FIG. 2 is a side cross-sectional view showing a lead frame with an adhesive tape attached to the lead frame.

FIG. 2 is a side cross-sectional view showing a lead frame 12 with an adhesive tape 50 attached to a first side 52 of the lead frame 12. As illustrated, the lead frame 12 includes a die pad 14 and lead fingers 16. The lead frame 12 may be formed of copper, an alloy of copper, a copper plated iron/nickel alloy, plated aluminum, or the like.

A wafer may be processed to form the lead frame 12 with the die pad 14 and the lead fingers 16 by wafer mounting and wafer sawing processes, as are known in the art.

Figure 3:
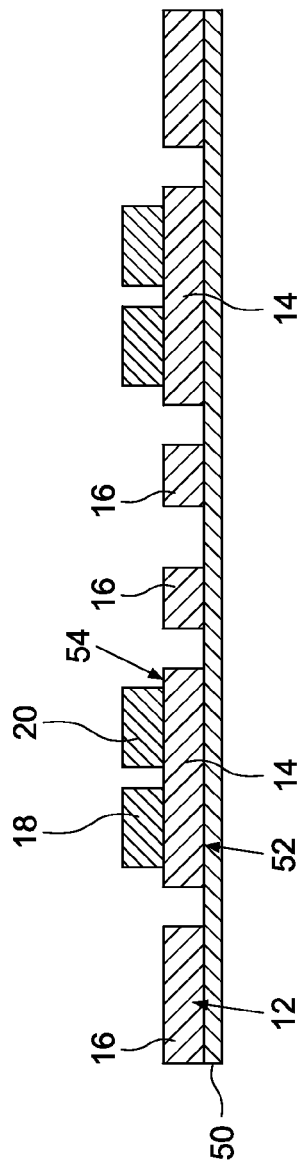
FIG. 3 illustrates a step of attaching a pressure sensor die and a second die to the lead frame.

FIG. 3 is an illustration of a step of attaching the pressure sensor die 18 and the second die 20 to a second side 54 of the lead frame 12. In this exemplary embodiment of the present invention, the pressure sensor die 18 and the second die 20 are attached to the die pad 14. Alternately, the pressure sensor die 18 and the second die 20 may be attached to separate die pads adjacent to each other on the lead frame 12. The pressure sensor die 18 and the second die 20 are attached to respective die pads 14 of the lead frame 12 with a die attach adhesive such as die-bonding epoxy.

Figure 4:
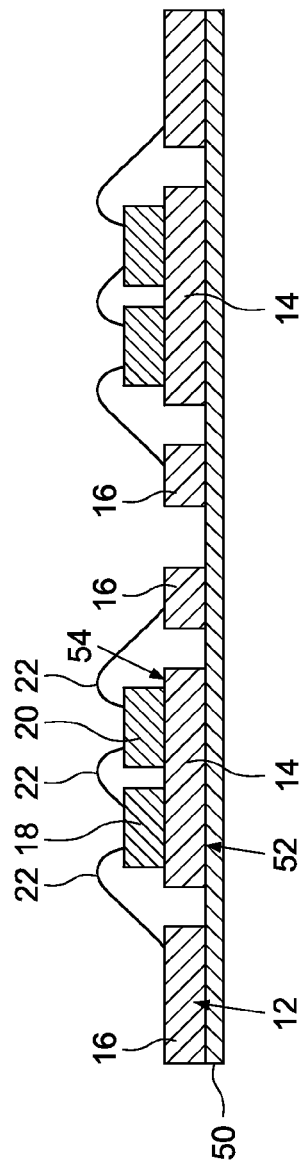
FIG. 4 illustrates a step of electrically connecting the pressure sensor die and the second die to the lead frame.

FIG. 4 shows the step of electrically connecting the pressure sensor dies 18 and the second die 20 to the lead frame 12. In this exemplary embodiment of the invention, bond pads of the pressure sensor die 18 and the second die 20 are electrically connected to the lead fingers 16 of the lead frame 12 with the wires 22 using a well known wire bonding process and known wire bonding equipment.

Another way of connecting the pressure sensor die 18 and the second die 20 to the lead frame 12 is through flip-chip bumps (not shown) attached to an underside of the pressure sensor die 18 and the second die 20. The flip-chip bumps may include solder bumps, gold balls, molded studs, or combinations thereof. The bumps may be formed or placed on the pressure sensor die 18 and the second die 20 using known techniques such as evaporation, electroplating, printing, jetting, stud bumping and direct placement. The pressure sensor die 18 and the second die 20 are flipped and the bumps are aligned with contact pads (not shown) of the lead fingers 16.

Figure 5:
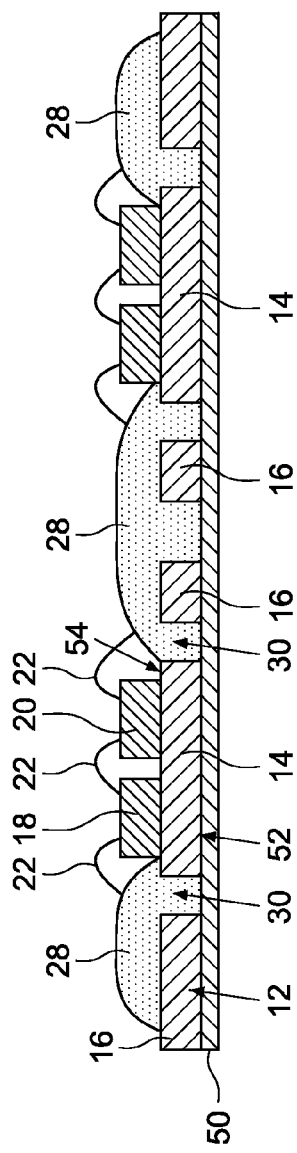
FIG. 5 illustrates a step of dispensing an encapsulating material onto the lead frame.

FIG. 5 shows the step of dispensing an encapsulating material 28 such as epoxy onto the second side 54 of the lead frame 12. The encapsulating material 28 covers the lead fingers 16 and parts of the wires 22 proximate the lead fingers 16. In one embodiment of the present invention, the encapsulating material 28 is deposited on the lead frame 12 with a well known glob top dispensing process using known dispensing equipment. The deposition of the encapsulating material 28 is performed such that the encapsulating material 28 substantially covers the lead fingers 16 and gaps 30 between the die pad and the lead fingers 16.

Figure 6:
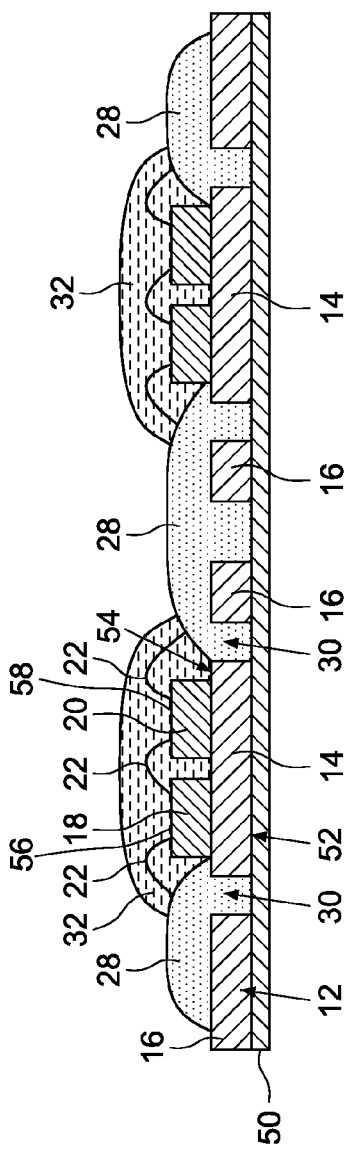
FIG. 6 illustrates a step of dispensing a gel on respective top surfaces of the pressure sensor die and the second die.

FIG. 6 shows the step of dispensing a gel 32 on top surfaces 56 and 58 of the pressure sensor die 18 and the second die 20. The gel 32 such as a silicon-based gel may be dispensed on the pressure sensor die 18 and the second die 20 to cover the die bond pads and parts of the wires 22 proximate to the die bond pads. The gel 32 may be dispensed with a nozzle of a conventional dispensing machine, as is known in the art.

Figure 7:
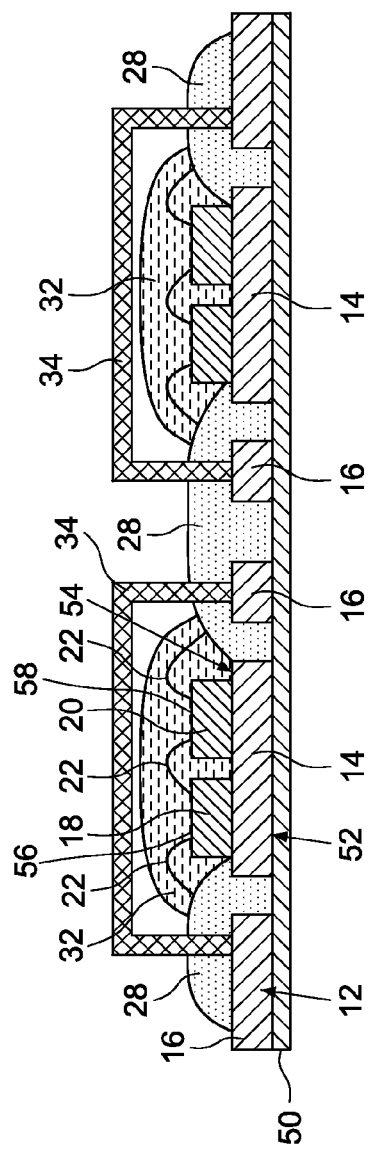
FIG. 7 is a side cross-sectional view showing a lid attached to the lead frame.

FIG. 7 is a side cross-sectional view showing a lid 34 attached to the lead frame 12. The lid 34 covers the pressure sensor die 18 and the second die 20 and the gel 32 thereon. In this exemplary embodiment of the present invention, edges of the lid 34 penetrate and are embedded within the encapsulating material 28. In one embodiment of the present invention, the lead frame 12 includes tie bars that extend outwardly from corners of the die pad 14 and the lid 34 includes legs that contact the tie bars and side edges that are isolated from the lead fingers 16.

Figure 8:
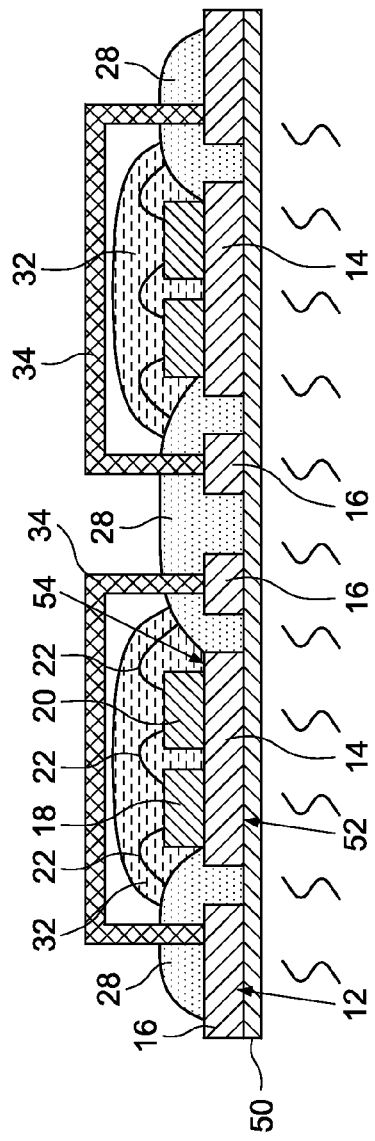
FIG. 8 illustrates a step of curing the encapsulating material and the gel dispensed on the lead frame.

The lid 34 facilitates grounding to the die flag and allows more encapsulating material to hold the wire leads 22 together. The encapsulating material 28 and the gel 30 are subsequently cured in a conventional oven, as illustrated in FIG. 8 to form an array of packaged pressure sensor dies.

Figure 9:
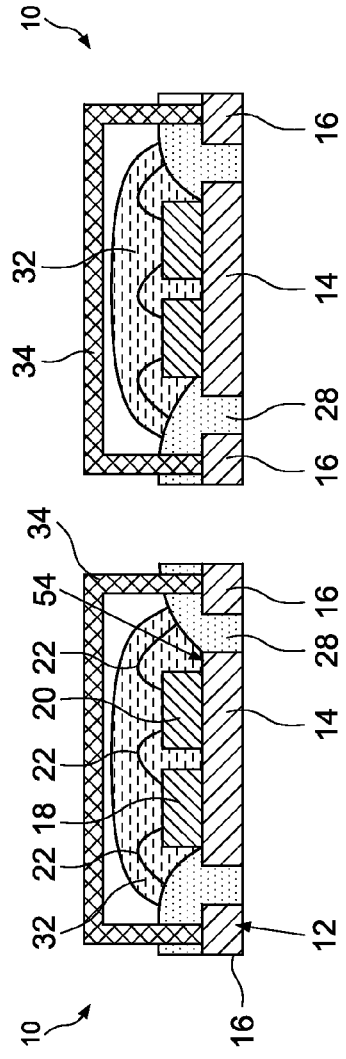
FIG. 9 illustrates a step of separating an array of packaged pressure sensor dies into individual packaged pressure sensor dies.

At this point in the process, the tape 50 is removed from the lead frame 12, as shown in FIG. 9. FIG. 9 shows individual sensor packages 10 being separated from each other by a singulation process. Singulation processes are well known and may include cutting with a saw or a laser.

Figure 10:
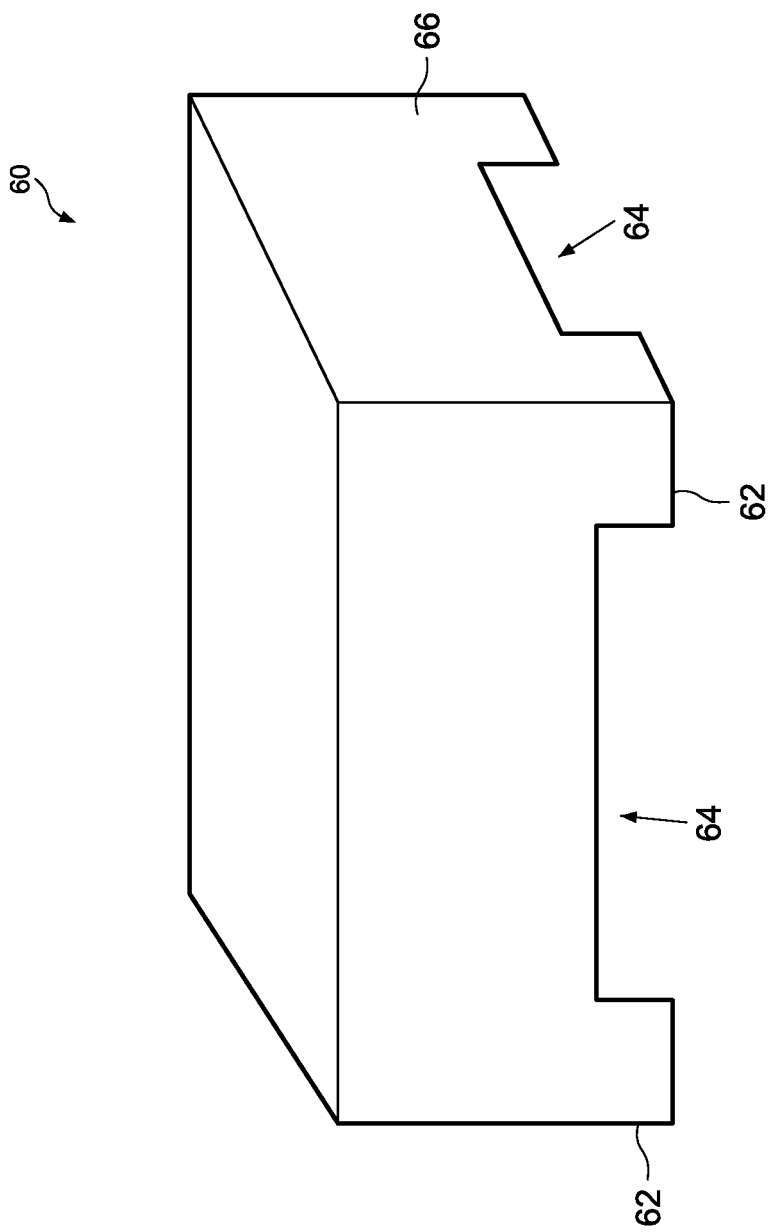
FIG. 10 is a perspective view of an exemplary configuration of the lid employed in the pressure sensor package of FIG. 9.

FIG. 10 is a perspective view of an exemplary configuration of a lid 60 that may be employed in the pressure sensor package 10 of FIG. 9. The lid 60 includes legs 62 that are embedded within the encapsulating material 28 and contact the tie bars 36 (see FIG. 1B) of the die pad 14. In this exemplary embodiment, the lid 60 includes cut-outs 64 along the sides 66 such that the sides 66 of the lid 60 penetrate the encapsulating material 28 without contacting the lead fingers 16. As will be appreciated by those skilled in the art, a variety of other configurations for the lid 34 may be envisaged.

The present invention, as described above, allows for packaging a pressure sensor die without requiring premolded lead frames to package the die. A simple deposition technique such as glob top dispensing process is employed to dispense an encapsulating material to cover the lead fingers of the lead frame with the electrical connections thereto. A gel is dispensed to cover the die bond pads and the electrical connections thereto. Subsequently, the lid is attached to the package to cover the die, bond wires and the gel without the need of a premolded lead frame, which requires a metal lid to be placed on a mold wall to protect the pressure sensor dies.

Thus, the present invention provides a method of packaging a pressure sensor die such as high density QFN packages for automotive applications that does not require a premolded lead frame for facilitating lid attachment thereby reducing manufacturing costs for such packages.

By now it should be appreciated that there has been provided an improved pressure sensor package and a method of forming the improved pressure sensor package. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A packaged pressure sensor die, comprising:
    a lead frame with at least one die pad and a plurality of lead fingers that surround the at least one die pad;
    a pressure sensor die attached to the die pad and electrically coupled to the lead fingers with bond wires;
    a glob top encapsulating material deposited onto a top surface of the lead fingers and filling gaps between the at least one die pad and the lead fingers, and covering the connections of the bond wires to the lead fingers;
    a gel disposed on a top surface of the pressure sensor die, and covering the connections of the bond wires to the pressure sensor die; and
    a lid that covers the pressure sensor die, the gel and the glob top encapsulating material, wherein the lid penetrates the glop top encapsulating material and contacts the lead frame.

2. The packaged pressure sensor die of claim 1, wherein the pressure sensor die comprises a piezo resistive transducer (PRT) die.

3. The packaged pressure sensor die of claim 1, further comprising a second die attached to the top surface of the die pad, and electrically coupled to respective ones of the plurality of lead fingers, wherein the glob top encapsulating material covers both of the dies.

4. The packaged pressure sensor die of claim 1, wherein the glob top encapsulating material comprises epoxy.

5. The packaged pressure sensor die of claim 1, wherein the gel comprises silicon-based gel.

6. The packaged pressure sensor die of claim 1, wherein the packaged pressure sensor die comprises a quad flat no-lead (QFN) package.

7. The packaged pressure sensor die of claim 1, wherein the lead frame includes tie bars that extend outwardly from the die pad and the lid contacts the tie bars and is electrically isolated from the lead fingers.

* * * * *